US010707433B2

(12) United States Patent
Guo

(10) Patent No.: US 10,707,433 B2
(45) Date of Patent: Jul. 7, 2020

(54) DISPLAY PANEL, METHOD OF MANUFACTURING THE SAME, AND DISPLAY DEVICE

(71) Applicants: HEFEI BOE OPTOELECTRONICS TECHNOLOGY CO., LTD., Anhui (JP); BOE Technology Group Co., Ltd., Beijing (CN)

(72) Inventor: Yuanhui Guo, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/327,448

(22) PCT Filed: Mar. 2, 2018

(86) PCT No.: PCT/CN2018/077907
§ 371 (c)(1),
(2) Date: Feb. 22, 2019

(87) PCT Pub. No.: WO2019/010986
PCT Pub. Date: Jan. 17, 2019

(65) Prior Publication Data
US 2019/0198793 A1 Jun. 27, 2019

(30) Foreign Application Priority Data
Jul. 11, 2017 (CN) .......................... 2017 1 0563547

(51) Int. Cl.
*H01L 51/50* (2006.01)
*H01L 51/52* (2006.01)
(Continued)

(52) U.S. Cl.
CPC ...... *H01L 51/5012* (2013.01); *H01L 27/3258* (2013.01); *H01L 51/5209* (2013.01);
(Continued)

(58) Field of Classification Search
CPC . H01L 51/56; H01L 51/5262; H01L 51/5209; H01L 51/5012
See application file for complete search history.

(56) References Cited

U.S. PATENT DOCUMENTS 7,812,345 B2 * 10/2010 Yoshida .............. H01L 51/0003
257/40
9,543,547 B2    1/2017 Yang et al.
(Continued)

FOREIGN PATENT DOCUMENTS

CN    101681997 A    3/2010
CN    101752400 A    6/2010
(Continued)

OTHER PUBLICATIONS

International Search Report and Written Opinion (including English translations of search report and Box V of the Written Opinion) for International Application No. PCT/CN2018/077907, dated Jun. 7, 2018, 15 pages.
(Continued)

*Primary Examiner* — Earl N Taylor
(74) *Attorney, Agent, or Firm* — Westman, Champlin & Koehler, P.A.

(57) ABSTRACT

A display panel, a method of manufacturing the display panel, and a display device are provided, the display panel includes a substrate; an underlayer on the substrate; a first electrode on the underlayer; an electroluminescent functional layer on the first electrode; and a second electrode on the electroluminescent functional layer, a longitudinal section of the underlayer has a contour which is concave from
(Continued)

the first electrode toward the substrate as a whole, and in the longitudinal section, a thickness of a region of the underlayer close to a center of the panel is not greater than a thickness of a region of the underlayer close to an edge of the panel.

20 Claims, 6 Drawing Sheets

(51) Int. Cl.
      *H01L 27/32*       (2006.01)
      *H01L 51/56*       (2006.01)
      *H01L 51/00*       (2006.01)

(52) U.S. Cl.
      CPC .......... *H01L 51/5262* (2013.01); *H01L 51/56* (2013.01); *H01L 51/003* (2013.01); *H01L 2227/323* (2013.01); *H01L 2227/326* (2013.01); *H01L 2251/558* (2013.01)

(56) References Cited

U.S. PATENT DOCUMENTS

| | | | |
|---|---|---|---|
| 9,594,193 B2 | 5/2017 | Guo et al. | |
| 9,673,266 B2* | 6/2017 | Zhang | H01L 51/5209 |
| 9,711,577 B2* | 7/2017 | Zhang | H01L 51/56 |
| 2002/0105267 A1* | 8/2002 | Mochizuki | H01L 51/5262 |
| | | | 313/512 |
| 2003/0142247 A1* | 7/2003 | Nishiyama | G02B 5/0226 |
| | | | 349/67 |
| 2003/0201716 A1 | 10/2003 | Yamazaki et al. | |
| 2004/0135160 A1 | 7/2004 | Cok | |
| 2005/0099792 A1* | 5/2005 | Matsui | G02B 6/0036 |
| | | | 362/603 |
| 2007/0290607 A1* | 12/2007 | Okada | G02B 5/1871 |
| | | | 313/504 |
| 2008/0179615 A1* | 7/2008 | Kao | H01L 33/20 |
| | | | 257/98 |
| 2010/0182692 A1* | 7/2010 | Kenmochi | G02B 5/1861 |
| | | | 359/485.05 |
| 2014/0167017 A1* | 6/2014 | Shinotsuka | H05B 33/10 |
| | | | 257/40 |
| 2014/0192309 A1* | 7/2014 | Nakagawa | G02F 1/13452 |
| | | | 349/150 |
| 2014/0306241 A1* | 10/2014 | Hirakata | H01L 51/5281 |
| | | | 257/79 |
| 2015/0138463 A1* | 5/2015 | Jinta | H01L 51/5218 |
| | | | 349/33 |
| 2016/0124128 A1 | 5/2016 | Guo et al. | |
| 2016/0268552 A1 | 9/2016 | Yang et al. | |
| 2016/0357294 A1* | 12/2016 | Ozeki | C03C 15/00 |
| 2017/0194392 A1* | 7/2017 | Wang | H01L 27/3237 |
| 2017/0324063 A1* | 11/2017 | Ohara | H01L 51/5234 |
| 2018/0166648 A1 | 6/2018 | Dai et al. | |
| 2018/0180252 A1* | 6/2018 | Fu | H01L 27/3283 |
| 2019/0019968 A1* | 1/2019 | He | B29D 11/00326 |
| 2019/0198793 A1* | 6/2019 | Guo | H01L 51/5209 |

FOREIGN PATENT DOCUMENTS

| | | | | |
|---|---|---|---|---|
| CN | 103332031 A | | 10/2013 | |
| CN | 103943787 A | | 7/2014 | |
| CN | 103943787 A | * | 7/2014 | ......... H01L 51/5072 |
| CN | 103985739 A | | 8/2014 | |
| CN | 203760520 U | | 8/2014 | |
| CN | 104103673 A | * | 10/2014 | ......... H01L 51/0017 |
| CN | 104103673 A | | 10/2014 | |
| CN | 104362257 A | | 2/2015 | |
| CN | 204167324 U | | 2/2015 | |
| CN | 104505469 A | | 4/2015 | |
| CN | 104637988 A | | 5/2015 | |
| CN | 104733632 A | | 6/2015 | |
| CN | 105633121 A | | 6/2016 | |
| CN | 106299143 A | | 1/2017 | |
| CN | 106449657 A | | 2/2017 | |
| CN | 106450036 A | | 2/2017 | |
| CN | 106647031 A | | 5/2017 | |
| CN | 106842381 A | | 6/2017 | |
| CN | 107316949 A | | 11/2017 | |
| JP | 06201909 A | * | 7/1994 | |
| JP | 2001-118680 A | | 4/2001 | |
| JP | 2005091873 A | | 4/2005 | |
| WO | WO-2007086159 A1 | * | 8/2007 | ............ G02F 1/1339 |
| WO | WO-2013175130 A1 | * | 11/2013 | ......... H01L 51/5206 |
| WO | WO-2014020817 A1 | * | 2/2014 | ......... H01L 27/3246 |
| WO | 2016/084727 A1 | | 6/2016 | |
| WO | WO-2016084727 A1 | * | 6/2016 | ............... G09F 9/30 |

OTHER PUBLICATIONS

First Office Action, including Search Report, for Chinese Patent Application No. 201710563547.6, dated Jun. 28, 2018, 22 pages.
Third Office Action, including Search Report, for Chinese Patent Application No. 201710563547.6, dated Nov. 18, 2019, 44 pages.

* cited by examiner

DISPLAY PANEL, METHOD OF MANUFACTURING THE SAME, AND DISPLAY DEVICE

CROSS-REFERENCE TO RELATED APPLICATION

This application is a Section 371 National Stage Application of International Application No. PCT/CN2018/077907, filed on Mar. 2, 2018. This application claims the benefit of Chinese Patent Application No. 201710563547.6 filed on Jul. 11, 2017 in the State Intellectual Property Office of China, the disclosures of which are incorporated herein by reference.

TECHNICAL FIELD

The present disclosure relates to the field of display technology, and in particular, to a display panel, a method of manufacturing the display panel, and a display device.

BACKGROUND

Organic light-emitting diode (OLED) display panels have been used more and more. In the OLED display panels, a curved OLED display panel (having at least one curved region) is more and more popular in the market because of its unique shape and meeting specific display requirements. However, in the curved OLED display panel, there is a chromatic aberration between the central region and the edge region of the display panel.

SUMMARY

One of the objectives of the present disclosure is to provide a display panel, a method of manufacturing the display panel, and a display device.

An embodiment of the present disclosure provides a display panel comprising: a substrate; an underlayer on the substrate; a first electrode on the underlayer; an electroluminescent functional layer on the first electrode; and a second electrode on the electroluminescent functional layer, wherein a longitudinal section of the underlayer has a contour which is concave from the first electrode toward the substrate as a whole, and in the longitudinal section, a thickness of a region of the underlayer close to a center of the panel is not greater than a thickness of a region of the underlayer close to an edge of the panel.

In some embodiments, in the longitudinal section, the underlayer has a plurality of protruding structures on a surface of the underlayer facing away from the substrate.

In some embodiments, a height of the protruding structure in the region of the underlayer close to the center of the panel is not greater than a height of the protruding structure in the region of the underlayer close to the edge of the panel.

In some embodiments, an angle between a protruding direction of the protruding structure in the region of the underlayer close to the center of the panel and a plane where the substrate is located is not smaller than an angle between a protruding direction of the protruding structure in the region of the underlayer close to the edge of the panel and the plane where the substrate is located.

In some embodiments, the protruding direction of the protruding structure points to a line perpendicular to the panel at the center of the panel from the substrate to the first electrode.

In some embodiments, the protruding direction of the protruding structure points away from a line perpendicular to the panel at the center of the panel from the substrate to the first electrode.

In some embodiments, the underlayer comprises a planar region and curved regions on both sides of the planar region in the longitudinal cross-section, the planar region having the same thickness, each curved region having a gradually increase thickness in a direction from the center of panel towards one side, where the curved region is located, of the panel.

In some embodiments, the underlayer comprises a planar region and curved regions on both sides of the planar region in the longitudinal cross-section, the protruding structures on the planar region having the same height, a height of the protruding structure on each curved regions gradually increasing in a direction from the center of panel towards one side, where the curved region is located, of the panel.

In some embodiments, a protruding direction of each of the protruding structures in the planar region is perpendicular to a plane where the substrate is located, and an angle between a protruding direction of the protruding structure on each curved region and the plane where the substrate is located decreases in the direction from the center of panel towards one side, where the curved region is located, of the panel.

In some embodiments, a bottom of at least one of the protruding structures extends to the substrate.

In some embodiments, in the longitudinal section, the thickness of the underlayer is gradually increased from the center of the panel toward the edge of the panel.

In some embodiments, in the longitudinal section, the thickness of the underlayer is gradually increased in a stepwise manner from the center of the panel toward the edge of the panel.

In some embodiments, in a lateral cross section, the underlayer has the same thickness from the center of the panel to the edge of the panel.

In some embodiments, the first electrode conforms to a shape of the underlayer.

An embodiment of the present disclosure provides a method of manufacturing a display panel, comprising: providing a first substrate; forming an underlayer on the first substrate; forming a first electrode on the underlayer; forming an electroluminescent functional layer on the first electrode; and forming a second electrode on the electroluminescent functional layer, wherein a longitudinal section of the underlayer has a contour which is concave from the first electrode toward the substrate as a whole, and in the longitudinal section, a thickness of a region of the underlayer close to a center of the panel is not greater than a thickness of a region of the underlayer close to an edge of the panel.

In some embodiments, forming the underlayer on the first substrate comprises: laying a photoresist layer on the first substrate; and stamping the photoresist layer.

In some embodiments, stamping the photoresist layer comprises: stamping the photoresist layer to form the underlayer comprising a planar region and curved regions on both sides of the planar region in the longitudinal cross section.

In some embodiments, the method further comprising: forming a plurality of protruding structures on a surface of the underlayer facing away from the first substrate by using a dual beam interference lithography process.

In some embodiments, the method further comprising: peeling off the first substrate; and adhering the display panel without the first substrate onto a second substrate, wherein the curved regions of the underlayer in the display panel is aligned with curved regions of the second substrate, respectively, and the planar region of the underlayer in the display panel is aligned with a planar region of the second substrate.

An embodiment of the present disclosure provides a display device comprising the display panel.

DETAILED DESCRIPTION OF THE EMBODIMENTS

Figure 1:
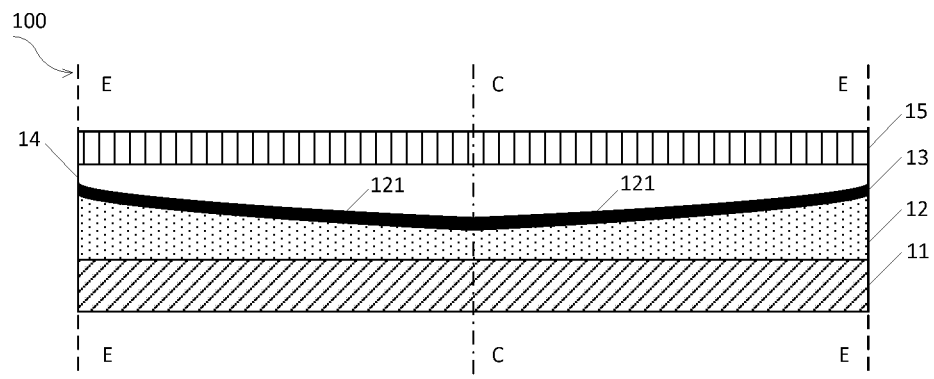
FIG. 1 illustrates a schematic structural view of a longitudinal section of an OLED display panel according to an exemplary embodiment of the present disclosure.

In order to clearly illustrate the objects, technical solutions, and advantages of the present disclosure, the embodiments of the present disclosure will be described in detail below with reference to the accompanying drawings. It is apparent that the described embodiments are parts of the embodiments of the present disclosure, and not all of the embodiments. It is to be understood that the following description of the embodiments is intended to explain and illustrate the general conception of the present disclosure and should not be construed as limiting the disclosure. In the description and drawings, the same or similar reference numerals are used to refer to the same or similar components or elements. For the sake of clarity, the drawings are not necessarily drawn to scale, and some of the known components and structures may be omitted in the drawings.

Unless otherwise defined, technical terms or scientific terms used in the present disclosure are intended to be understood in the ordinary meaning of the ordinary skill of the art. The words "first," "second," and similar terms used in the present disclosure do not denote any order, quantity, or importance, but are used to distinguish different components. The word "comprising" or "comprises" or the like means the element or the item preceding the word includes the element or item listed after the word and its equivalent without excluding other components or objects. The words "connecting" or "connected" and the like are not limited to physical or mechanical connections, but may include electrical connections, whether direct or indirect. "Upper", "lower", "left", "right", "top" or "bottom" and the like are only used to indicate relative positional relationship. When the absolute position of the object to be described is changed, the relative positional relationship may also be changed correspondingly. When an element such as a layer, a film, a region or a substrate is referred to as being "on" or "under" another element, the element can be directly "on" or "under" another element, or there may be intermediate elements. The drawings in the present disclosure are schematic views of longitudinal sections, and the longitudinal section in the present disclosure refers to a section taken along the horizontal direction (from left to right) of the user when the user faces the display panel, in particular, in the longitudinal section, the display panel may be bent in the use state. Unless otherwise stated, "close to the center of the panel", "close to the edge of the panel", "away from the center of the panel" used in the present disclosure are referred to as the positional relationship in the longitudinal section. The lateral section in the present disclosure refers to a section taken along the vertical direction (from top to bottom) of the user when the user faces the display panel. The vertical direction and the horizontal direction are perpendicular to each other. In particular, in the lateral section, the display panel is always flat in the use state.

FIG. 1 illustrates a schematic structural view of a longitudinal section of an OLED display panel 100 according to an exemplary embodiment of the present disclosure. As shown in FIG. 1, the display panel 100 includes a substrate 11, an underlayer 12 on the substrate 11, a first electrode 13 on the underlayer 12, an organic light-emitting functional layer 14 on the first electrode 13, and a second electrode 15 on the organic light-emitting functional layer 14. In the longitudinal section, a thickness of a region of the underlayer 12 close to a center C-C of the panel is less than a thickness of a region of the underlayer 12 close to an edge E-E of the panel. For any two regions of the underlayer, the one which is closer to the center C-C of the panel may be called the region of the underlayer close to the center C-C of the panel, the other may be called the region of the underlayer close to the edge E-E of the panel. In this embodiment and the following embodiments, the center C-C of the panel and the edge E-E of the panel are both described relative to the whole panel, a plurality of pixels are provided at both the center C-C of the panel and the edge E-E of the panel.

The substrate 11 may be, for example, a glass substrate. The underlayer 12 may be made, for example, of a photoresist material. The first electrode 13 and the second electrode 15 may be made of metal such as copper, aluminum, molybdenum, neodymium, silver or titanium or an alloy material thereof. One of the first electrode 13 and the second electrode 15 may be an anode, and the other may be a cathode. The organic light-emitting functional layer 14 may include a plurality of functional layers such as a hole injection layer, a hole transport layer, an organic light-emitting layer, an electron transport layer, an electron injection layer and so on. When a voltage is applied between the first electrode 13 and the second electrode 15, the organic light-emitting functional layer 14 may emit light. Those skilled in the art may understand that the organic light-emitting functional layer 14 may include a plurality of array-arranged sub-pixels respectively emitting red light, green light or blue light to realize color display. FIG. 1 only schematically shows a basic structure of the OLED display panel. Those skilled in the art will appreciate that the display panel 100 may also include other layer structures and components known in the art, which are not limited in the present disclosure. For example, a flexible TFT array may be included between the glass substrate 11 and the underlayer 12.

The thickness of the substrate 11 is, for example, in the range of 0.1 to 0.5 mm. The thickness of the underlayer 12 is, for example, in the range of 100 to 2000 nm. The thickness of the first electrode 13 is, for example, in the range of 50 to 200 nm. The thickness of the organic light-emitting functional layer 14 is, for example, in the range of 150 to 1000 nm. The thickness of the second electrode 15 is, for example, in the range of 5 to 50 nm.

The thickness of the region of the underlayer 12 close to the center C-C of the panel is less than the thickness of the region of the underlayer 12 close to the edge E-E of the panel. As shown in FIG. 1, the thickness of the underlayer 12 may gradually increase from the center C-C of the panel toward the edge E-E of the panel, so that an upper surface 121 of the underlayer 12 is a smooth concave curved surface. However, the present disclosure is not limited thereto, and the thickness of the underlayer 12 may also be increased in a stepwise manner from the center C-C of the panel toward the edge E-E of the panel. For example, an intermediate portion of the underlayer 12 is formed as a planar region, and edge portions of the underlayer 12 on both sides of the intermediate portion are formed as curved regions. The underlayer 12 may also be in an upward-steps shape from the center C-C of the panel toward the edge E-E of the panel.

According to the embodiment shown in FIG. 1, by forming the underlayer in the OLED display panel, wherein the thickness of the region of the underlayer close to the center of the panel is smaller than the thickness of the region of the underlayer close to the edge of the panel, it is possible to eliminate a chromatic aberration phenomenon between the central region and the edge region of the OLED display panel.

Figure 2:
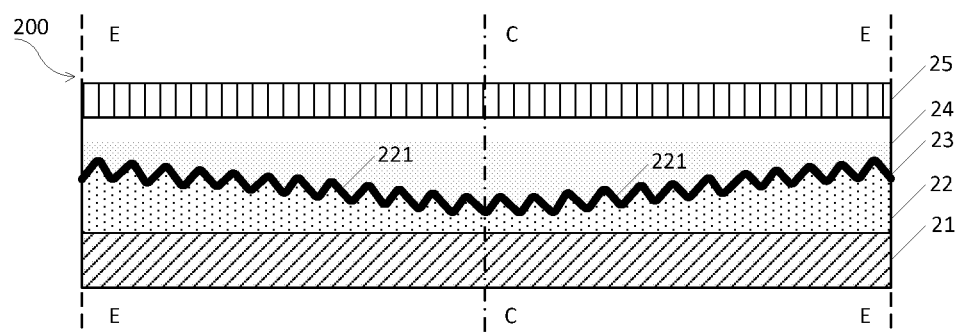
FIG. 2 illustrates a schematic structural view of a longitudinal section of an OLED display panel according to another exemplary embodiment of the present disclosure.

FIG. 2 illustrates a schematic structural view of a longitudinal section of an OLED display panel 200 according to another exemplary embodiment of the present disclosure. As shown in FIG. 2, the display panel 200 includes a substrate 21, an underlayer 22 on the substrate 21, a first electrode 23 on the underlayer 22, an organic light-emitting functional layer 24 on the first electrode 23, and a second electrode 25 on the organic light-emitting functional layer 24. A thickness of a region of the underlayer 22 close to a center C-C of the panel is less than a thickness of a region of the underlayer 12 close to an edge E-E of the panel. This embodiment may also have the same effect of eliminating the chromatic aberration phenomenon between the central region and the edge region of the OLED display panel as the embodiment shown in FIG. 1.

The embodiment shown in FIG. 2 differs from the embodiment shown in FIG. 1 in that the display panel 200 further includes a plurality of protruding structures 221 formed on a surface of the underlayer 22 facing away from the substrate 21. The cross-sectional shape of the protruding structures 221 may be, for example, a zigzag shape, a wave shape, a triangle shape, a trapezoid shape, or the like. By providing the protruding structures 221, a total reflection phenomenon inside a microcavity structure formed between the first electrode 23 and the second electrode 25 may be reduced, and the light extraction efficiency of the display panel 200 may be increased. Other aspects of this embodiment are the same as those of the embodiment shown in FIG. 1, and details are not described herein again.

Figure 3:
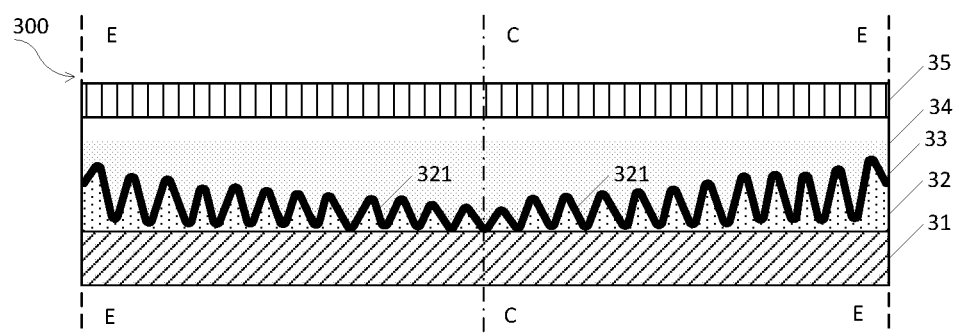
FIG. 3 illustrates a schematic structural view of a longitudinal section of an OLED display panel according to another exemplary embodiment of the present disclosure.

FIG. 3 illustrates a schematic structural view of a longitudinal section of an OLED display panel 300 according to another exemplary embodiment of the present disclosure.

The OLED display panel 300 in FIG. 3 is a variant embodiment of the OLED display panel 200 in FIG. 2. As shown in FIG. 3, the display panel 300 includes a substrate 31, an underlayer 32 on the substrate 31, a first electrode 33 on the underlayer 32, an organic light-emitting functional layer 34 on the first electrode 33, and a second electrode 35 on the organic light-emitting functional layer 34. A thickness of a region of the underlayer 32 close to a center C-C of the panel is less than a thickness of a region of the underlayer 32 close to an edge E-E of the panel. A plurality of protruding structures 321 are formed on a surface of the underlayer 32 facing away from the substrate 31. This embodiment may also have the same effect as the embodiment shown in FIG. 2.

The embodiment shown in FIG. 3 differs from the embodiment shown in FIG. 2 in that, in the display panel 300, a bottom of protruding structure 321 may penetrate the underlayer 22 and extend to an upper surface of the substrate 21. In other words, the whole underlayer 32 may be composed of the plurality of protruding structures. This embodiment may further eliminate the chromatic aberration phenomenon between the central region and the edge region of the OLED display panel. Other aspects of this embodiment are the same as those of the embodiment shown in FIG. 2, and details are not described herein again.

Figure 4:
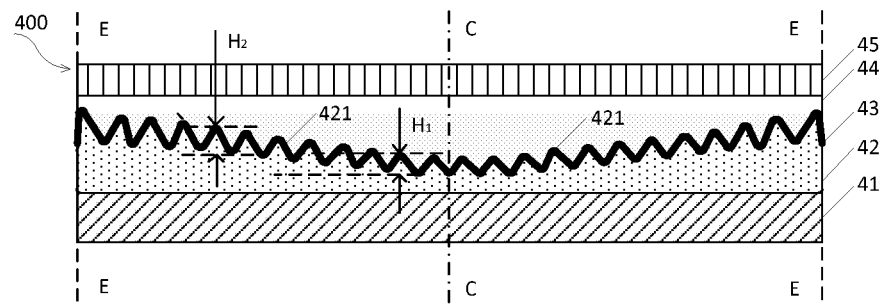
FIG. 4 illustrates a schematic structural view of a longitudinal section of an OLED display panel according to another exemplary embodiment of the present disclosure.

FIG. 4 illustrates a schematic structural view of a longitudinal section of an OLED display panel according to another exemplary embodiment of the present disclosure. As shown in FIG. 4, the display panel 400 includes a substrate 41, an underlayer 42 on the substrate 41, a first electrode 43 on the underlayer 42, an organic light-emitting functional layer 44 on the first electrode 43, and a second electrode 45 on the organic light-emitting functional layer 44. A thickness of a region of the underlayer 42 close to a center C-C of the panel is less than a thickness of a region of the underlayer 42 close to an edge E-E of the panel. A plurality of protruding structures 421 are formed on a surface of the underlayer 42 facing away from the substrate 41. This embodiment may also have the same effect as the embodiment shown in FIG. 2.

The embodiment shown in FIG. 4 differs from the embodiment shown in FIG. 2 in that, in the display panel 400 shown in FIG. 4, a height H1 of the protruding structure 421 in the region of the underlayer 42 close to the center C-C of the panel 400 is smaller than a height H2 of the protruding structure 421 in the region of the underlayer 42 close to the edge E-E of the panel 400. According to this embodiment, the chromatic aberration phenomenon between the central region and the edge region of the OLED display panel may be further eliminated by making the height of the protruding structure in the region of the underlayer close to the center of the panel be smaller than the height of the protruding structure in the region of the underlayer close to the edge of the panel. Other aspects of this embodiment are the same as those of the embodiment shown in FIG. 2, and details are not described herein again.

Figure 5:
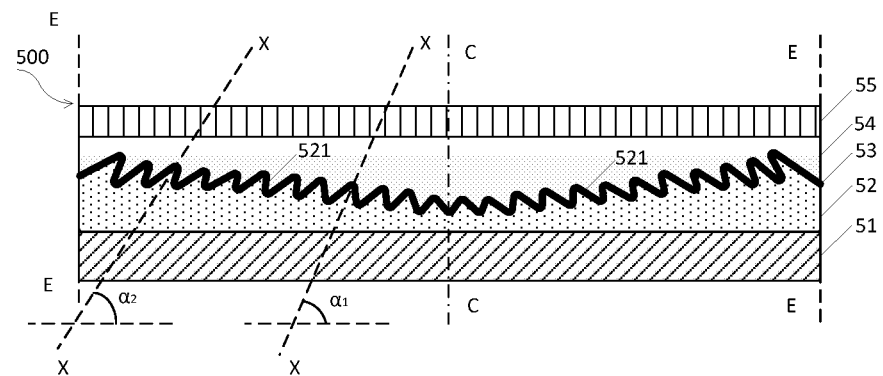
FIG. 5 illustrates a schematic structural view of a longitudinal section of an OLED display panel according to another exemplary embodiment of the present disclosure.

FIG. 5 illustrates a schematic structural view of a longitudinal section of an OLED display panel according to another exemplary embodiment of the present disclosure. As shown in FIG. 5, the display panel 500 includes a substrate 51, an underlayer 52 on the substrate 51, a first electrode 53 on the underlayer 52, an organic light-emitting functional layer 54 on the first electrode 53, and a second electrode 55 on the organic light-emitting functional layer 54. A thickness of a region of the underlayer 52 close to the center C-C of the panel is less than a thickness of a region of the underlayer 52 close to the edge E-E of the panel. A plurality of protruding structures 521 are formed on a surface of the underlayer 52 facing away from the substrate 51. A height of the protruding structure 521 in the region of the underlayer 52 close to the center C-C of the panel 500 is smaller than a height of the protruding structure 521 in the region of the underlayer 52 close to the edge E-E of the panel. This embodiment may also have the same effect as the embodiment as shown in FIG. 4.

The embodiment shown in FIG. 5 differs from the embodiment shown in FIG. 4 in that, the protruding structures 521 are inclined toward a central line of the panel. That is, tip ends of the protruding structures point to the central line of the panel. The central line is a line perpendicular to the panel at the center of the panel. Moreover, an angle α1 of a protruding direction X-X of the protruding structure 521 in the region of the underlayer 52 close to the center C-C of the panel 500 and a plane where the substrate 51 is located is larger than an angle α2 of a protruding direction X-X of the protruding structure 521 in the region of the underlayer 52 close to the edge E-E of the panel and the plane where the substrate 51 is located. The protruding direction of the protruding structure 521 means a direction in which a central line of the protruding structure extends. Other aspects of this embodiment are the same as those of the embodiment shown in FIG. 4, and details are not described herein again.

For example, the angle formed by the protruding direction of the protruding structure 521 of the underlayer 52 and the plane where the substrate 51 is located may gradually decrease from the center C-C of the panel toward the edge E-E of the panel. For example, the protruding direction of the protruding structure 521 of the underlayer 52 at the center C-C is perpendicular to the display panel, and the angle formed by the protruding direction of the protruding structure 521 of the underlayer 52 at the edge E-E and the plane where the substrate is located is close to 0 degree. From the center C-C of the panel to the edge E-E of the panel, the angle formed by the protruding direction of the protruding structure 521 of the underlayer 52 and the plane where the substrate 51 is located may be gradually changed from 90 degrees to nearly 0 degree.

However, the present disclosure is not limited thereto, and the angle formed by the protruding direction of the protruding structure 521 and the plane where the substrate 51 is located may also decrease in a stepwise manner from the center C-C of the panel toward the edge E-E of the panel in other ways. For example, in the case where an intermediate portion of the underlayer 52 is formed as a planar region and side portions on both sides of the intermediate portion are formed as curved regions, for the protruding structures 521 in the planar region which is in the middle of the underlayer 52, the angle formed by the protruding direction of the protruding structure 521 and the plane where the substrate 51 is located may be 90 degrees; for the protruding structures 521 in the curved regions, the angle formed by the protruding direction of the protruding structure 521 and the plane where the substrate 51 is located may gradually decrease toward both sides of the panel. Other aspects of this embodiment are the same as those of the embodiment shown in FIG. 4, and details are not described herein again.

This embodiment can be used for a convex display device. The convex display device means that a display surface of the display device facing the viewer is a convex surface. When the display panel 500 shown in FIG. 5 is used for the convex display device, the glass substrate 51 needs to be peeled off, and then the other portion of the display panel 500 is adhered onto a surface of a rigid curved substrate of a display device. In this case, since the surface of the rigid curved substrate is a convex surface, after the display panel 500 is adhered onto the surface of the rigid curved substrate, the protruding direction of the protruding structure 521 of the underlayer 52 of the display panel 500 is changed from inclined with respect to the central line of the panel to substantially parallel to the central line of the panel, which may further eliminate the chromatic aberration phenomenon between the central region and the edge region of the OLED display panel.

Figure 6:
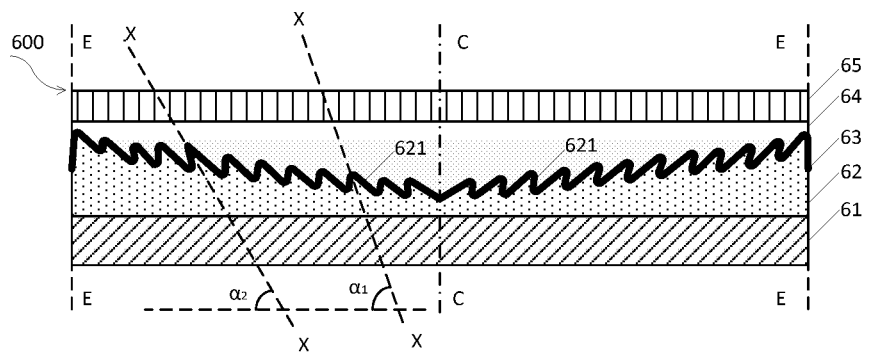
FIG. 6 illustrates a schematic structural view of a longitudinal section of an OLED display panel according to another exemplary embodiment of the present disclosure.

FIG. 6 illustrates a schematic structural view of a longitudinal section of an OLED display panel 600 according to another exemplary embodiment of the present disclosure. As shown in FIG. 6, the display panel 600 includes a substrate 61, an underlayer 62 on the substrate 61, a first electrode 63 on the underlayer 62, an organic light-emitting functional layer 64 on the first electrode 63, and a second electrode 65 on the organic light-emitting functional layer 64. A thickness of a region of the underlayer 62 close to a center C-C of the panel is less than a thickness of a region of the underlayer 62 close to an edge E-E of the panel. A plurality of protruding structures 621 are formed on a surface of the underlayer 62 facing away from the substrate 61. A height H1 of the protruding structure 621 on the region of the underlayer 62 close to the center C-C of the panel 600 is smaller than a height H2 of the protruding structure 621 on the region of the underlayer 62 close to the edge E-E of the panel. This embodiment may also have the same effect as the embodiment as shown in FIG. 4.

The embodiment shown in FIG. 6 differs from the embodiment shown in FIG. 4 is that, in the display panel 600 shown in FIG. 6, the protruding structures 621 are inclined away from a central line of the panel, that is, the tip ends of the protruding structures points away from the central line of the panel. Moreover, an angle α1 of a protruding direction X-X of the protruding structure 621 in the region of the underlayer 62 close to the center C-C of the panel 600 and a plane where the substrate 61 is located is larger than an angle α2 of a protruding direction X-X of the protruding structure 621 in the region of the underlayer 62 close to the edge E-E of the panel and the plane where the substrate 61 is located. Other aspects of this embodiment are the same as those of the embodiment shown in FIG. 4, and details are not described herein again.

For example, the angle formed by the protruding direction of the protruding structure 621 of the underlayer 62 and the plane where the substrate 61 is located may gradually decrease from the center C-C of the panel toward the edge E-E of the panel. For example, the protruding direction of the protruding structure 621 of the underlayer 62 at the center C-C is perpendicular to the display panel, and the angle formed by the protruding direction of the protruding structure 621 of the underlayer 62 at the edge E-E and the plane where the substrate is located is close to 0 degree. From the center C-C of the panel to the edge E-E of the panel, the angle formed by the protruding direction of the protruding structure 621 of the underlayer 62 and the plane where the substrate 61 is located may be gradually changed from 90 degrees to nearly 0 degree.

However, the present disclosure is not limited thereto, and the angle formed by the protruding direction of the protruding structure 621 and the plane where the substrate 61 is located may also decrease in a stepwise manner from the center C-C of the panel toward the edge E-E of the panel. For example, in the case where an intermediate portion of the underlayer 62 is formed as a planar region and side portions on both sides of the intermediate portion are formed as curved regions, for the protruding structures 621 in the planar region which is in the middle of the underlayer 62, the angle formed by the protruding direction of the protruding structure 621 and the plane where the substrate 61 is located may be 90 degrees; for the protruding structures 621 in the curved regions, the angle formed by the protruding direction of the protruding structure 621 and the plane where the substrate 61 is located may gradually decrease toward both sides of the panel. Other aspects of this embodiment are the same as those of the embodiment shown in FIG. 4, and details are not described herein again.

This embodiment can be used for a concave display device. The concave display device means that a display surface of the display device facing the viewer is a concave surface.

When the display panel 600 shown in FIG. 6 is used for the concave display device, the glass substrate 61 needs to be peeled off, and then the other portion of the display panel 600 is adhered onto a surface of a rigid curved substrate of a display device. In this case, since the surface of the rigid curved substrate is a concave surface, after the display panel 600 is adhered onto the surface of the rigid curved substrate, the protruding direction of the protruding structure 621 of the underlayer 62 of the display panel 600 is changed from inclined with respect to the central line of the panel to substantially parallel to the central line of the panel, which may further eliminate the chromatic aberration phenomenon between the central region and the edge region of the OLED display panel.

Figure 7:
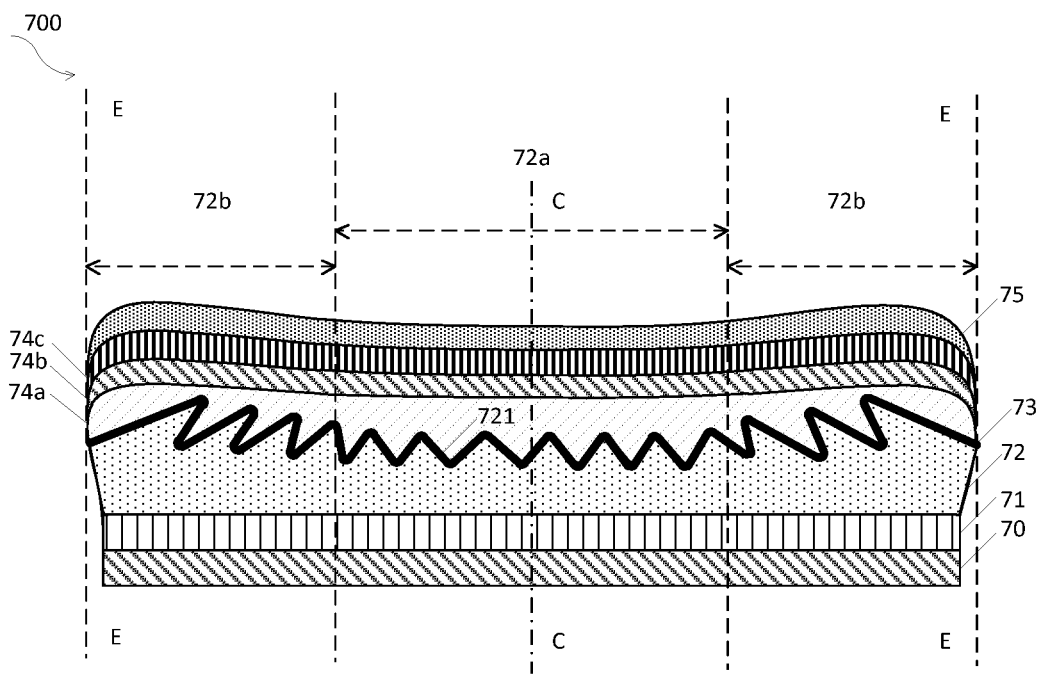
FIG. 7 illustrates a schematic structural view of a longitudinal section of an OLED display panel according to another exemplary embodiment of the present disclosure.

FIG. 7 shows a schematic structural view of an OLED display panel 700 according to an embodiment of the present disclosure. As shown in FIG. 7, the display panel 700 includes a substrate 70, a TFT array 71 on the substrate 70, a underlayer 72 on the TFT array 71, an anode 73 on the underlayer 72, an organic light-emitting functional layer 74 on the anode 73, and a cathode 75 on the organic light-emitting functional layer 74. As shown in figure, the organic light-emitting functional layer 74 includes a hole transport layer 74a, a light-emitting layer 74b, and an electron transport layer 74c. The anode 73 may include a plurality of sub-anodes arranged in an array, and each sub-anode corresponds to one TFT in the TFT array, and the anode 73 as a whole conforms to a shape of the underlayer 72. In other embodiments, the cathode 75 may have an array structure corresponding to the array of sub-anodes, and may also be a single continuous electrode.

As shown in FIG. 7, the underlayer 72 includes a planar region 72a and curved regions 72b on both sides of the planar region 72a. The planar region 72a has the same thickness, and a thickness of each of the curved regions 72b gradually increases toward the corresponding side, where the curved region is located, of the panel 700. A plurality of protruding structures 721 are formed on a surface of the underlayer 72 facing away from the substrate 71. Heights of the protruding structures 721 in the planar region 72a which is in the middle of the underlayer 72 are the same, and heights of the protruding structures 721 in each of curved region 72b of the underlayer 72 are gradually increased toward the corresponding side, where the curved region is located, of the panel. Angles of the protruding directions of the protruding structures 721 in the planar region 72a which is in the middle of the underlayer 72 and the plane where the substrate 71 is located are all 90 degrees. The protruding structures 721 in the curved regions 72b are inclined to the central line of the panel, that is, tip ends of the protruding structures point to the central line of the panel. The angle formed by the protruding direction of the protruding structure 721 in the curved region 72b and the plane where the substrate 71 is located gradually decreases from the center toward the edge of the panel 700. Other aspects of this embodiment are the same as those of the embodiment shown in FIG. 4, and details are not described herein again. This embodiment may also have the effect of eliminating the chromatic aberration phenomenon between the central region and the edge region of the display panel.

FIGS. 8A-8G are schematic views showing a manufacturing process of the OLED display panel shown in FIG. 7.

Figure 8A:
FIGS. 8A-8H are schematic views showing a manufacturing process of the OLED display panel shown in FIG. 7.

As shown in FIG. 8A, first, a glass substrate (first substrate) 70 is provided.

Figure 8B:
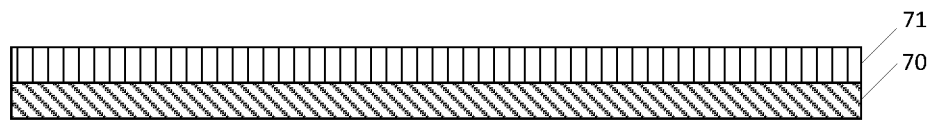

Next, as shown in FIG. 8B, a TFT array 71 is formed on the glass substrate 70. The array 71 includes TFT transistors for driving the anode 73 and other necessary components.

Figure 8C:
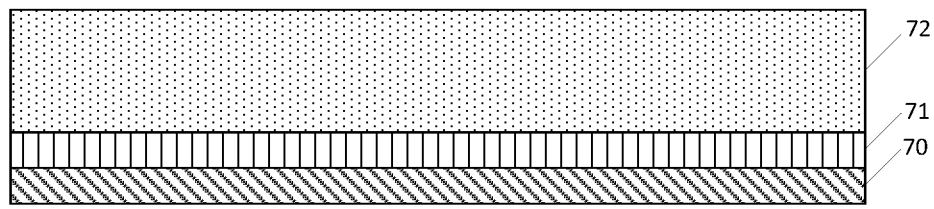

Next, as shown in FIG. 8C, an underlayer 72 is formed on the TFT array 71. For example, a negative photoresist layer having a thickness in the range of 200 to 4000 nm is laid on the TFT array 71 for forming the underlayer.

Figure 8D:
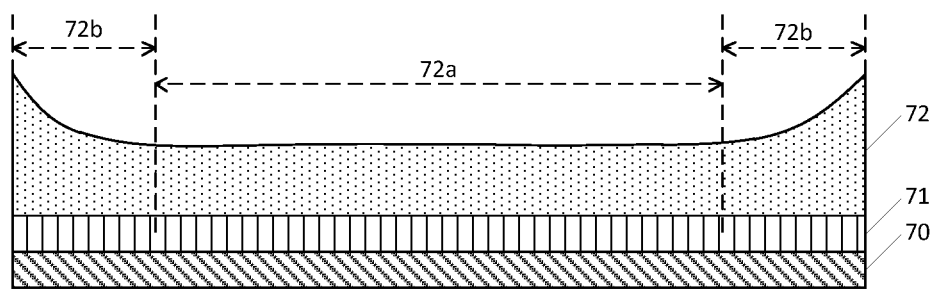

Next, as shown in FIG. 8D, the thickness of the region of the underlayer 72 close to the center of the panel is made smaller than the thickness of the region of the underlayer 72 close to the edge of the panel, for example by stamping. Specifically, the photoresist layer is stamped by using a stamping plate such that a surface of the photoresist layer facing away from the substrate has a desired shape. In this embodiment, the underlayer 72 is formed into a planar region 72a located at an intermediate portion of the panel and curved regions 72b located at both sides of the planar region 72a by stamping. The planar region 72a has the same thickness, and thickness of each of the curved regions 72b gradually increases toward the corresponding side, where the curved region is located, of the panel 700. For example, the thickness of the planar region 72a is in the range of 100-1500 nm, and the thickness of the curved regions 72b is in the range of 100-2000 nm.

Figure 8E:
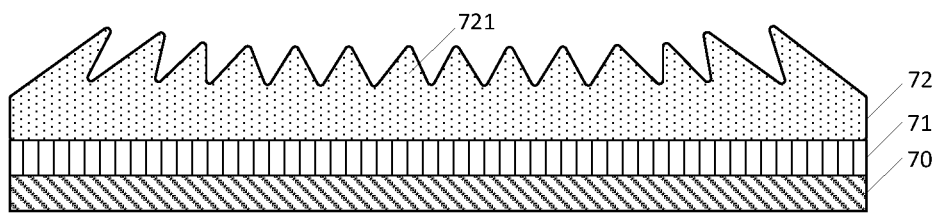

Next, as shown in FIG. 8E, a plurality of protruding structures 721 are formed on the surface of the underlayer 72 facing away from the substrate 71. For example, the plurality of protruding structures 721 are formed on the upper surface of the underlayer by using a dual beam interference lithography process. The dual beam interference lithography process is used to prepare the protruding structure 721. The optical path system is relatively simple and has high resolution. The dual beam interference lithography process does not require strict light source conditions and may be applied to most photoresists. It has high feasibility and is suitable for producing large-size panel.

In the dual beam interference lithography process, the formed protruding structures 721 may have different heights by changing the power of the beams. For example, the heights of the protruding structures 721 in the planar region 72a in the middle of the underlayer 72 are the same, and the heights of the protruding structures 721 in each of curved region 72b of the underlayer 72 are gradually increased toward the corresponding side, where the curved region is located, of the panel. For example, the heights of the protruding structures may be in the range of 100-2000 nm.

Alternatively, the power of the beam may be selected such that the protruding structures 721 extend through the underlayer 72 to the substrate 71.

In addition, in the dual beam interference lithography process, the light beam may always perform lithography perpendicular to the surface of the substrate 71. Thus, with respect to the planar region 72a of the underlayer 72, the light beam is also perpendicular to an upper surface of the planar region 72a to form the protruding structure whose the projection direction is substantially perpendicular to the upper surface of the underlayer 72. With respect to the curved region 72b of the underlayer 72, the light beam is incident on an upper surface of the curved region 72b at an incident angle which is less than 90 degrees. After refracted, the light beam is inclined in a direction away from the center of the display panel so that the protruding direction of the protruding structure formed by lithography is inclined towards the center of the panel.

Alternatively, in the dual-beam interference lithography process, the beam may be always perpendicular to the upper surface of the underlayer 72 during lithography. Thus, with respect to the planar region 72a of the underlayer 72, the light beam is perpendicular to the upper surface of the planar region 72a, thereby forming the protruding structure whose the projection direction is substantially perpendicular to the upper surface of the underlayer 72. With respect to the curved region 72b of the underlayer 72, the light beam is also perpendicular to the upper surface of the curved surface region 72b (i.e., perpendicular to a tangent line to the curved region), and the angle, formed by lithography, between the protruding direction of the protruding structure 721 and the plane where the substrate 71 is located gradually decreases from the center of panel towards one side, where the curved region is located, of the panel.

Figure 8F:
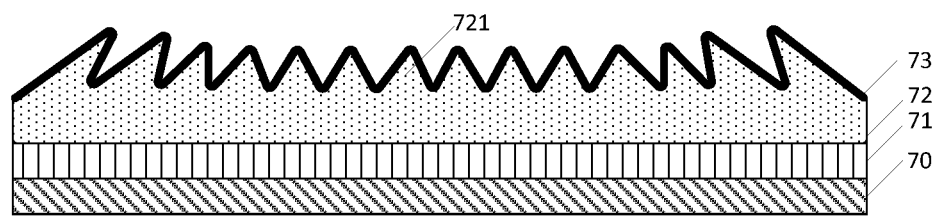

Next, as shown in FIG. 8F, the first electrode 73, that is, an anode, is formed on the underlayer 72 provided with the protruding structure 721. Specifically, a metal layer having a uniform thickness may be deposited on the upper surface of the underlayer 72 by evaporation or sputtering such that the metal layer substantially has a shape conforming to the shape of the upper surface of the underlayer 72. The metal layer may specifically be made of a metal material such as copper, aluminum, molybdenum, neodymium, silver or titanium or an alloy thereof. The metal layer is then patterned, for example by an etch process, to form the anode of the OLED display panel.

Figure 8G:
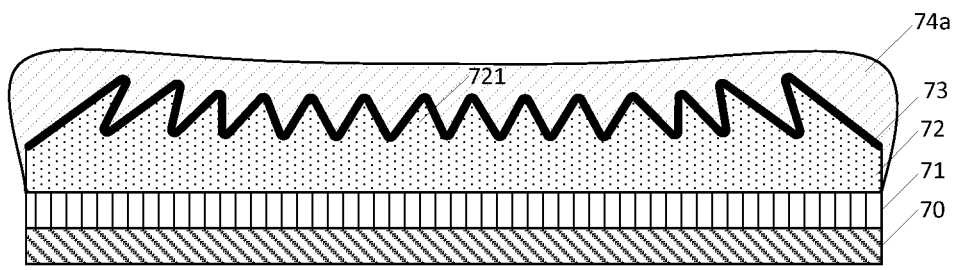
Figure 8H:
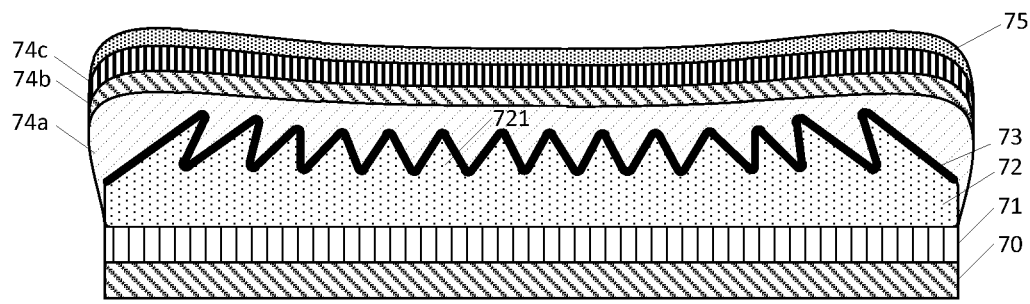

Next, as shown in FIGS. 8G and 8H, an organic light-emitting functional layer 74 and a second electrode 75 are sequentially formed on the first electrode 73.

Specifically, a step of forming the organic light-emitting functional layer 74 includes: first, as shown in FIG. 8G, a hole transport layer 74a is deposited on the first electrode 73 by a spin coating process. The thickness of the hole transport layer 74a may be thick to form a substantially flat upper surface. For example, the thickness of the hole injection layer or hole transport layer 74a may be in the range of 100 to 2000 nm.

Next, as shown in FIG. 8H, the light-emitting layer 74b and the electron transport layer 74c are prepared by a conventional film formation process such as an evaporation process, and the layers are respectively patterned to form light-emitting units capable of emitting light of different colors. The thickness of the light-emitting layer 74b may be in the range of 5 to 100 nm, and the thickness of the electron transport layer 74c may be in the range of 5 to 100 nm. Next, as shown in FIG. 8H, a metal layer is deposited on the upper surface of the organic light-emitting functional layer 74 by a sputtering process, and the metal layer may specifically be made of a metal material such as copper, aluminum, molybdenum, neodymium, silver or titanium or an alloy thereof. The metal layer is then patterned, for example by an etch process, to form the cathode 75 of the display panel. In this way, the OLED display panel 700 as shown in FIG. 7 can be obtained.

Finally, the glass substrate 70 is peeled off from a main body of the finished OLED display panel, and the peeled main body of OLED display panel is adhered on a surface of a rigid curved substrate (second substrate) to obtain a curved OLED display panel 900 which is used for curved display. Specifically, the curved region 72b of the underlayer 72 in the OLED display panel 700 is aligned with a curved region of the rigid curved substrate having a corresponding shape, and the planar region 72a of the underlayer 72 in the OLED display panel 700 is aligned with a planar region of the rigid curved substrate, and the curved OLED display panel is obtained after adhering.

Figure 9:
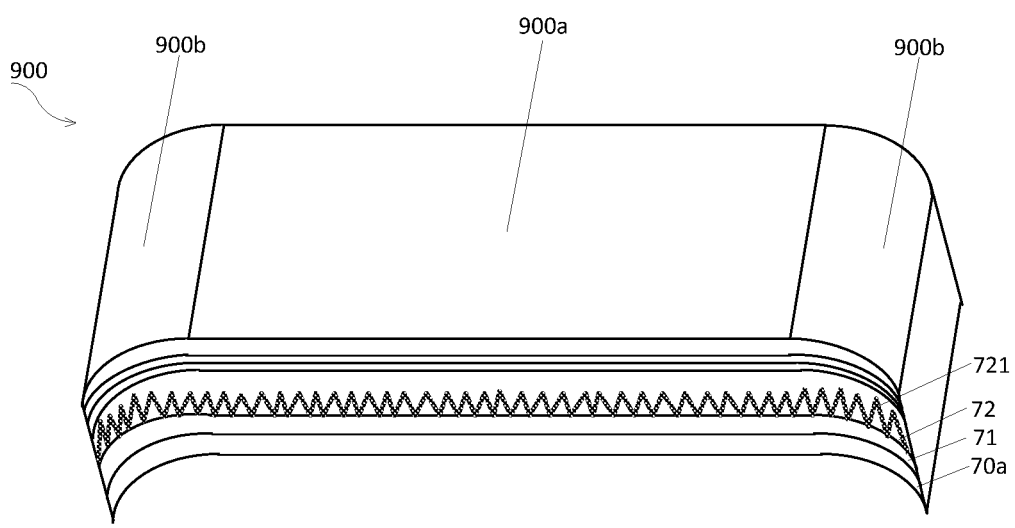
FIG. 9 is a schematic view showing a use state of the OLED display panel as shown in FIG. 7.

FIG. 9 is a schematic view showing a use state of the OLED display panel as shown in FIG. 7. As shown in FIG. 9, the curved OLED display panel 900 includes a planar region 900a located at an intermediate portion of the display panel and curved regions 900b located on both sides of the planar region 900a. The curved OLED display panel 900 may be used for a convex display device. As shown in FIG. 9, in the use state, the glass substrate 70 in the display panel shown in FIG. 7 is peeled off, and the display panel after peeling off the substrate 70 is adhered to the rigid second substrate 70a to form the curved display panel 900. As can be seen from FIG. 9, in the use state, the protruding directions of the protruding structures 721 of the underlayer 72 in the display panel 900 all become vertically upward, that is, parallel to the central line of the display panel. For the display panel 900, there is no obvious chromatic aberration phenomenon in an image displayed on both the planar region 900a and the curved surface region 900b.

In a lateral cross section perpendicular to the longitudinal section of the display panel described in the foregoing various embodiments of the present disclosure, a thickness of the underlayer is always the same from the center of the panel toward both edges of the panel. In other embodiments, in the lateral cross section of the display panel, the underlayer may be of the same or similar design as the longitudinal cross section of the underlayer in the various embodiments described above.

The foregoing embodiments of the present disclosure are described by taking an OLED display panel as an example. Those skilled in the art can understand that the technical solution in the present disclosure may also be applied to a QLED display panel, and the QLED display panel is similar to the OLED display panel, and the difference is that the electroluminescent functional layer of the OLED display panel is an organic light emitting functional layer, however the electroluminescent layer of the QLED display panel is an inorganic light emitting functional layer.

Further embodiments of the present disclosure also provide a display device comprising the display panel as described in the foregoing embodiments. The display device is, for example, a device having a display function such as a mobile phone, a tablet computer, a notebook computer, a digital photo frame, a personal digital assistant, a navigator, a television, a desktop computer, or the like. The disclosure is not limited herein.

Figure 10A:
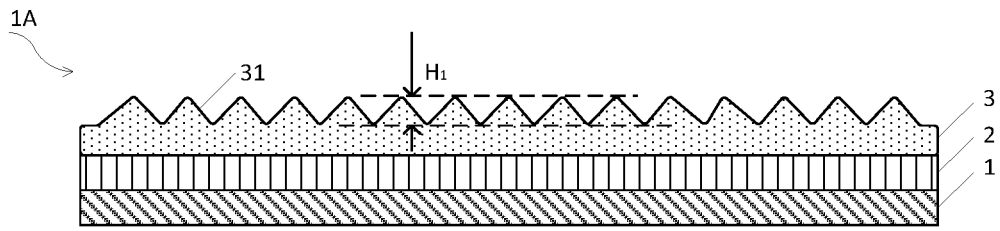
FIG. 10A illustrates a schematic partial structural view of a longitudinal section of a standard OLED display panel as a comparative example.
Figure 10B:
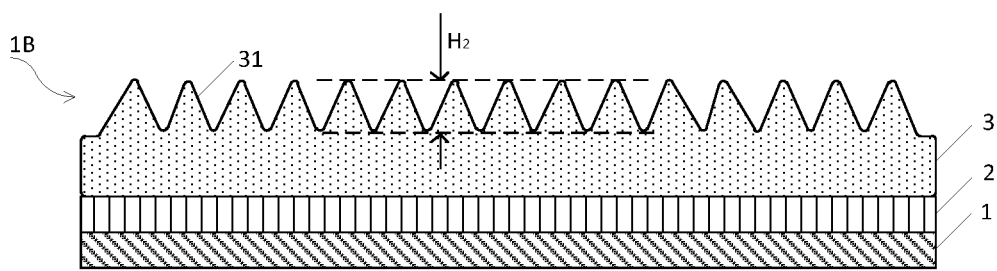
FIG. 10B illustrates a schematic partial structural view of a longitudinal section of a standard OLED display panel as another comparative example.
Figure 10C:
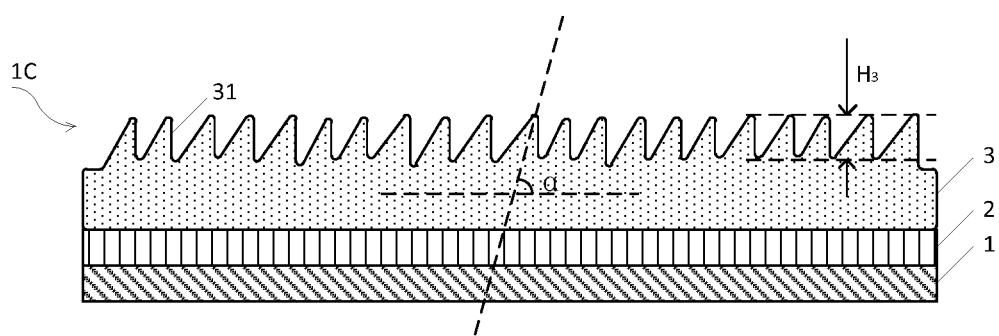
FIG. 10C illustrates a schematic partial structural view of a longitudinal section of another standard OLED display panel as a comparative example.

FIG. 10A illustrates a partial schematic structural view of a longitudinal section of a standard OLED display panel 1A as a comparative example; FIG. 10B illustrates a partial schematic structural view of a longitudinal section of a standard OLED display panel 1B as another comparative example; and FIG. 10C illustrates a partial schematic structural view of a longitudinal section of another standard OLED display panel 1C as a comparative example. For the sake of clarity, FIG. 10A-10C show only the glass substrate 1, the TFT substrate 2, the underlayer 3 of the OLED display panel, and the protruding structures 31 of the underlayer 3, other portions are not shown.

In the OLED display panel 1A of FIG. 10A, the height H1 of the protruding structure of the underlayer 3 is 40 nm, and the angle between the protruding structure 31 and the substrate 1 is 90 degrees. In the OLED display panel 1B of FIG. 10B, the height H2 of the protruding structure 31 of the underlayer 3 is 80 nm, and the angle between the protruding structure 31 and the substrate 1 is 90 degrees, and other parameters are the same as those of the OLED display panel of FIG. 10A. In the OLED display panel 1C of FIG. 10C, the height H3 of the protruding structure 21 of the underlayer 2 is 80 nm, and the angle α between the protruding structure 21 and the substrate 1 is 80 degrees, and other parameters are the same as those of the OLED display panel of FIG. 10B.

Optical characteristics of the OLED display panels 1A, 1B, and 1C respectively having the structures of FIGS. 10A, 10B, and 10C were simulated by a software (Techwiz) at a positive viewing angle ($\theta=0°$; $\Phi=0°$) and a side viewing angle ($\theta=45°$; $\Phi=0°$). $\theta$ represents an angle between a line of sight and the normal to the display panel, and $\Phi$ represents an angle between an orthographic projection of the line of sight on the display panel and the horizontal axis of the first quadrant.

The specific results of the simulation are as follows:
Panel 1A:
At positive viewing angle ($\theta=0°$; $\Phi=0°$), the green color coordinate is (0.21, 0.71) [CIE 1931], and brightness is 150 nit. CIE represents the international standard chromaticity space.
At the side viewing angle ($\theta=45°$; $\Phi=0°$), the green color coordinate is (0.25, 0.68) [CIE 1931], and the brightness is 100 nit.
Panel 1B:
At positive viewing angle ($\theta=0°$; $\Phi=0°$), the green color coordinate is (0.215, 0.705) [CIE 1931], and brightness is 180 nit.
At the side viewing angle ($\theta=45°$; $\Phi=0°$), the green color coordinate is (0.24, 0.69) [CIE 1931], and the brightness is 120 nit.
Panel 1C:
At positive viewing angle ($\theta=0°$; $\Phi=0°$), the green color coordinate is (0.220, 0.70) [CIE 1931], and brightness is 170 nit.
At the side viewing angle ($\theta=45°$; $\Phi=0°$), the green color coordinate is (0.22, 0.70) [CIE 1931], and the brightness is 135 nit.

For the curved display panel, the region closed to the center of the panel is observed at the positive viewing angle, and the region closed to the edge of the panel is observed at the side viewing angle. The smaller the difference in optical characteristics between the positive viewing angle and the side viewing angle, the smaller the chromatic aberration of the display panel is.

The simulation results show that when the intermediate portion of the display panel is set to be the same as the panel 10A and both side portion are set to be the same as the panel 10C, the chromatic aberration between the positive viewing angle and the side viewing angle is the smallest, and the uniformity of the panel is the best. It proves that the method of the present disclosure may effectively eliminate the chromatic aberration phenomenon between the central region and the edge region of the OLED display panel.

Embodiments of another aspect of the present disclosure provide a display device including the display panel according to any of the above embodiments. Examples of the display device may include a device having a display function, such as a mobile phone, a tablet computer, a notebook computer, a digital photo frame, a personal digital assistant, a navigator, a television, and the like, which is not limited in the present disclosure. According to the display device of the present disclosure, it is possible to eliminate the chromatic aberration phenomenon between the central region and the edge region of the display device having the curved surface, and improve the quality of the display image.

Although various embodiments of the present disclosure have been described above with reference to the drawings, those skilled in the art will understand that different embodiments may be combined or partially substituted without causing a conflict. Various modifications and changes can be made to the embodiments of the present disclosure without departing from the spirit of the invention. All such modifications and variations are intended to fall within the scope of the present disclosure. Therefore, the scope of the present disclosure should be determined by the scope defined by the claims.

What is claimed is:

1. A display panel comprising:
a substrate;
an underlayer on the substrate;
a first electrode on the underlayer;
an electroluminescent functional layer on the first electrode, the electroluminescent functional layer having a plurality of sub-pixel regions; and
a second electrode on the electroluminescent functional layer,
wherein an orthographic projection of the underlayer on the substrate covers orthographic projections of the plurality of sub-pixel regions on the substrate, a longitudinal section of the underlayer has a contour which is concave from the first electrode toward the substrate as a whole, and in the longitudinal section, a thickness of a region of the underlayer close to a center of the panel is not greater than a thickness of a region of the underlayer close to an edge of the panel.

2. The display panel according to claim 1, wherein in the longitudinal section, the underlayer has a plurality of protruding structures on a surface of the underlayer facing away from the substrate.

3. The display panel according to claim 2, wherein a height of a protruding structure of the plurality of protruding structures in the region of the underlayer close to the center of the panel is not greater than a height of a protruding structure of the plurality of protruding structures in the region of the underlayer close to the edge of the panel.

4. The display panel according to claim 2, wherein an angle between a protruding direction of a protruding structure of the plurality of protruding structures in the region of the underlayer close to the center of the panel and a plane where the substrate is located is not smaller than an angle between a protruding direction of a protruding structure of the plurality of protruding structures in the region of the underlayer close to the edge of the panel and the plane where the substrate is located.

5. The display panel according to claim 4, wherein a protruding direction of each of the plurality of the protruding structure points to a line perpendicular to the panel at the center of the panel from the substrate to the first electrode.

6. The display panel according to claim 4, wherein a protruding direction of each of the plurality of the protruding structures points away from a line perpendicular to the panel at the center of the panel from the substrate to the first electrode.

7. The display panel according to claim 1, wherein the underlayer comprises a planar region and curved regions on both sides of the planar region in the longitudinal section, the planar region having uniform thickness throughout, each curved region having a gradually increase thickness in a direction from the center of panel towards one side, where the curved region is located, of the panel.

8. The display panel according to claim 2, wherein the underlayer comprises a planar region and curved regions on both sides of the planar region in the longitudinal section, protruding structures of the plurality of protruding structures on the planar region having the same height, a height of a protruding structure of the plurality of protruding structures on each curved regions gradually increasing in a direction from the center of panel towards one side, where the curved region is located, of the panel.

9. The display panel according to claim 8, wherein a protruding direction of each of the protruding structures in the planar region is perpendicular to a plane where the substrate is located, and an angle between a protruding direction of the protruding structure on each curved region and the plane where the substrate is located decreases in the direction from the center of panel towards one side, where the curved region is located, of the panel.

10. The display panel according to claim 2, wherein a bottom of at least one of the protruding structures extends to the substrate.

11. The display panel according to claim 1, wherein in the longitudinal section, the thickness of the underlayer is gradually increased from the center of the panel toward the edge of the panel.

12. The display panel according to claim 1, wherein in the longitudinal section, the thickness of the underlayer is gradually increased in a stepwise manner from the center of the panel toward the edge of the panel.

13. The display panel according to claim 1, wherein in a lateral cross section, the underlayer has the same thickness from the center of the panel to the edge of the panel.

14. The display panel according to claim 1, wherein the first electrode conforms to a shape of the underlayer.

15. A method of manufacturing a display panel, comprising:
providing a first substrate;
forming an underlayer on the first substrate;
forming a first electrode on the underlayer;
forming an electroluminescent functional layer on the first electrode having a plurality of sub-pixel regions; and
forming a second electrode on the electroluminescent functional layer,
wherein an orthographic projection of the underlayer on the substrate covers orthographic projections of the plurality of sub-pixel regions of the substrate, a longitudinal section of the underlayer has a contour which is concave from the first electrode toward the substrate as a whole, and in the longitudinal section, a thickness of a region of the underlayer close to a center of the panel is not greater than a thickness of a region of the underlayer close to an edge of the panel.

16. The method according to claim 15, wherein forming the underlayer on the first substrate comprises:
laying a photoresist layer on the first substrate; and
stamping the photoresist layer.

17. The method according to claim 16, wherein stamping the photoresist layer comprises:
stamping the photoresist layer to form the underlayer comprising a planar region and curved regions on both sides of the planar region in the longitudinal section.

18. The method according to claim 15, further comprising:
forming a plurality of protruding structures on a surface of the underlayer facing away from the first substrate by using a dual beam interference lithography process.

19. The method according to claim 17, further comprising:
peeling off the first substrate; and
adhering the display panel without the first substrate onto a second substrate, wherein the curved regions of the underlayer in the display panel is aligned with curved regions of the second substrate, respectively, and the planar region of the underlayer in the display panel is aligned with a planar region of the second substrate.

20. A display device comprising the display panel of claim 1.

* * * * *